(12) United States Patent
Lin et al.

(10) Patent No.: US 11,974,366 B2
(45) Date of Patent: Apr. 30, 2024

(54) DISPLAY DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/121,570

(22) Filed: Mar. 14, 2023

(65) Prior Publication Data
US 2023/0232509 A1     Jul. 20, 2023

Related U.S. Application Data

(63) Continuation of application No. 16/950,844, filed on Nov. 17, 2020, now Pat. No. 11,627,646.

(30) Foreign Application Priority Data

Dec. 17, 2019    (CN) .......................... 201911303000.8

(51) Int. Cl.
    *H05B 33/14*        (2006.01)
    *B41F 15/34*        (2006.01)
    *H10K 50/11*        (2023.01)

(52) U.S. Cl.
    CPC ............ *H05B 33/14* (2013.01); *B41F 15/34* (2013.01); *H10K 50/11* (2023.02)

(58) Field of Classification Search
CPC .... H10K 50/11; H10K 50/856; H10K 50/858; H10K 50/865; H10K 59/122; H10K 59/126; H10K 71/00; H10K 59/38; H01L 27/156; H01L 33/508; H01L 33/58; H01L 2933/0041; H01L 2933/0058; H05B 33/14; B41F 15/34

See application file for complete search history.

*Primary Examiner* — Kevin Quarterman
(74) *Attorney, Agent, or Firm* — Winston Hsu

(57) ABSTRACT

A display device includes a substrate, an electroluminescence element, a partition structure, a light conversion element and an intermediate layer. The electroluminescence element is disposed above the substrate. The partition structure is disposed above the electroluminescence element and includes a first opening. The light conversion element is disposed in the first opening. The intermediate layer is disposed above the light conversion element and the partition structure. The intermediate layer has a first part and a second part. In a top-view direction, the first part overlaps the light conversion element, the second part overlaps the partition structure, and a thickness of the first part is greater than a thickness of the second part.

17 Claims, 14 Drawing Sheets

DISPLAY DEVICE

CROSS REFERENCE TO RELATED APPLICATIONS

This application is a continuation application of U.S. application Ser. No. 16/950,844, filed on Nov. 17, 2020. The content of the application is incorporated herein by reference.

BACKGROUND OF THE DISCLOSURE

1. Field of the Disclosure

The present disclosure relates to a display device, and more particularly to a display device with high reliability or high color purity.

2. Description of the Prior Art

Nowadays, electronic devices have been widely used. However, in the existing manufacturing technology, some materials contained in the electronic device are easily damaged during the manufacturing process (e.g., high temperature, high humidity or high pressure). Accordingly, industries make effort manufacturing an electronic device having high quality and/or high reliability.

SUMMARY OF THE DISCLOSURE

According to an embodiment, the present disclosure provides a display device including a substrate, an electroluminescence element, a partition structure, a light conversion element and an intermediate layer. The electroluminescence element is disposed above the substrate. The partition structure is disposed above the electroluminescence element and includes a first opening. The light conversion element is disposed in the first opening. The intermediate layer is disposed above the light conversion element and the partition structure. The intermediate layer has a first part and a second part. In a top-view direction, the first part overlaps the light conversion element, the second part overlaps the partition structure, and a thickness of the first part is greater than a thickness of the second part.

According to another embodiment, the present disclosure provides a display device including a substrate, another substrate, an electroluminescence element, a partition structure, a light conversion element and an intermediate layer. The another substrate is disposed opposite to the substrate. The electroluminescence element is disposed between the substrate and the another substrate. The partition structure is disposed between the electroluminescence element and the another substrate, wherein the partition structure includes a first opening. The light conversion element is disposed in the first opening. The intermediate layer is disposed between the light conversion element and the another substrate. The intermediate layer has a first part and a second part. In a top-view direction, the first part overlaps the light conversion element, the second part overlaps the partition structure, and a thickness of the first part is greater than a thickness of the second part.

These and other objectives of the present disclosure will no doubt become obvious to those of ordinary skill in the art after reading the following detailed description of the embodiment that is illustrated in the various figures and drawings.

DETAILED DESCRIPTION

Figure 1:
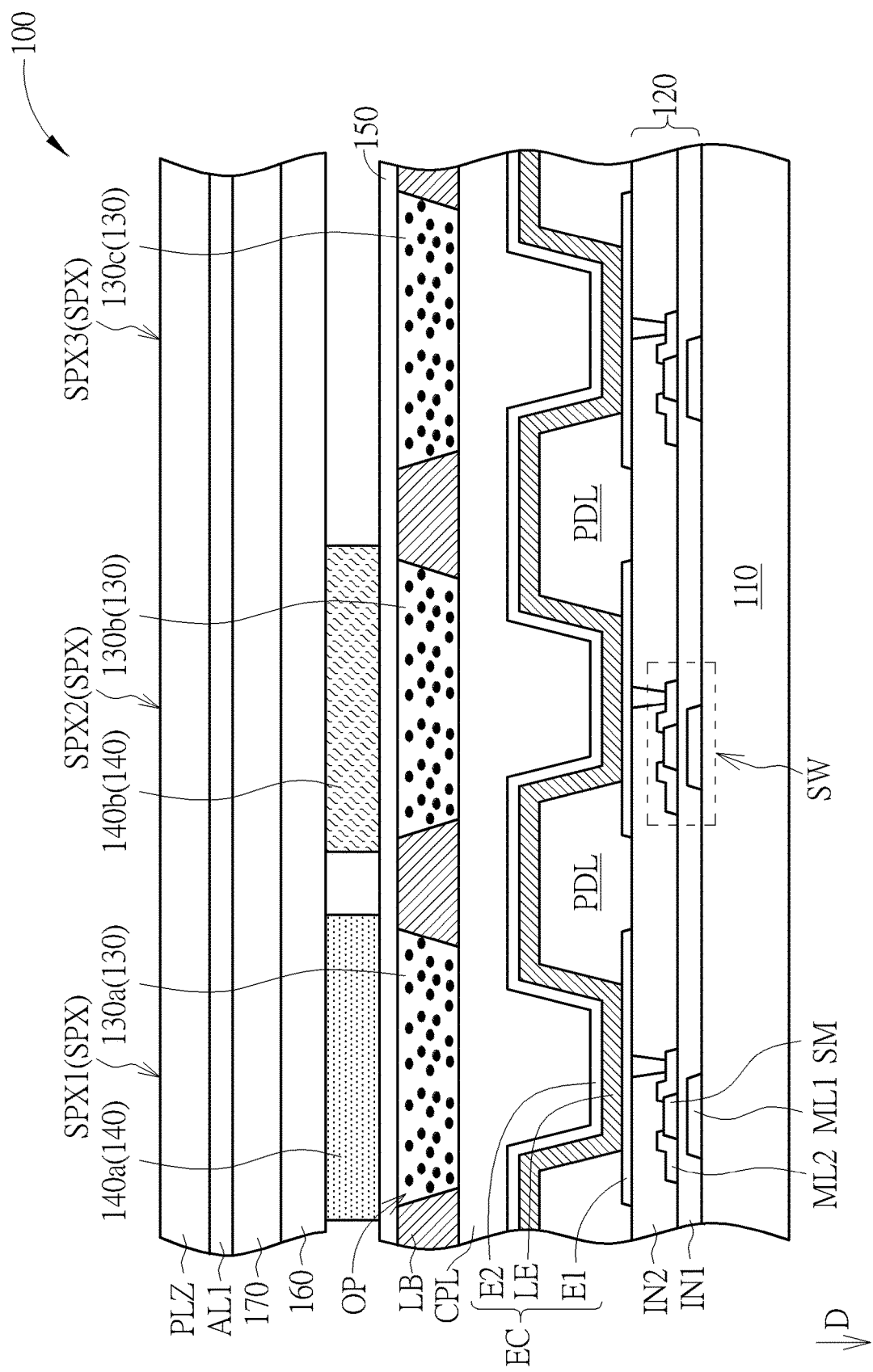
FIG. 1 is a schematic diagram showing a cross-sectional view of a display device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device in this disclosure, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

The directional terms used throughout the description and following claims, such as: "on", "up", "above", "down", "below", "front", "rear", "back", "left", "right", etc., are only directions referring to the drawings. Therefore, the directional terms are used for explaining and not used for limiting the present disclosure. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to "on another component", it may be directly on this another component, or other component (s) may exist between them. On the other hand, when the component is referred to "directly on another component (or the variant thereof)", any component does not exist between them. Furthermore, when the corresponding component is referred to "on another component", the corresponding component and the another component have a disposition relationship along a top-view direction, the corresponding component may be below or above the another component, and the disposition relationship along the top-view direction are determined by an orientation of the device.

It will be understood that when a component or layer is referred to as being "connected to" another component or layer, it can be directly connected to this another component or layer, or intervening components or intervening layers may be presented. In contrast, when a component is referred to as being "directly connected to" another component or layer, there are no intervening components or intervening layers presented. In addition, when the component is referred to "be coupled to/with another component (or the variant thereof)", it may be directly connected to this another component, or may be indirectly connected (such as electrically connected) to this another component through other component(s).

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. These terms are used only to discriminate a constituent element from other constituent elements in the specification, and these terms have no relation to the manufacturing order of these constituent components. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In the present disclosure, the electronic device may optionally include a display function, a touch sensing function, an antenna function, a light emitting function, other suitable function or a combination thereof, but not limited thereto. In some embodiments, the display device may include a tiled device, but not limited thereto. The display device may include organic light-emitting diodes (OLEDs), inorganic light-emitting diodes (LEDs) such as micro-LEDs and/or mini-LEDs, quantum dots (QDs) material, quantum-dot light-emitting diodes (QLEDs, QDLEDs), fluorescence material, phosphor material, other suitable material or a combination thereof, but not limited thereto. Moreover, the electronic device (such as display device) may include a color display device or a monochrome display device, and a shape of the electronic device may be a rectangle, a circle, a polygon, a shape having a curved edge or other suitable shape, but not limited thereto. In the following, in order to explain exemplarily, the electronic device may be a color display device as an example, but not limited thereto.

In some embodiments, the display device may include a plurality of pixels, and the pixel may include a plurality of sub-pixels. The numbers of the pixels and the sub-pixels and the arrangements of the pixels and the sub-pixels may be adjusted based on requirement(s). For instance, the sub-pixels may be arranged in an array, a stripe type arrangement, a Pentile arrangement or any other suitable arrangement. In addition, a top-viewing shape of a light emitting region of the sub-pixel may be a rectangle, a parallelogram, a chevron, a shape having a curved edge or other suitable shape, wherein the top-viewing shape of the light emitting region of the sub-pixel may be defined by such as an opening of a partition structure, and this content will be explained later.

Embodiments of the display device will be provided in the following, such that structures of the display device will be described in detail. However, the display device cannot be limited to the following embodiments, and the display device may be changed and adjusted based on practical requirement(s).

Referring to FIG. 1, FIG. 1 is a schematic diagram showing a cross-sectional view of a display device according to a first embodiment of the present disclosure. In some embodiments, the pixel may include three sub-pixels SPX, such as a green sub-pixel SPX1, a red sub-pixel SPX2 and a blue sub-pixel SPX3, but not limited thereto. In some embodiments, the number and colors of the sub-pixels SPX contained in the pixel may be changed based on requirement(s). In FIG. 1, the display device 100 may include a substrate 110. The material of the substrate 110 may include glass, quartz, ceramic, sapphire, polyimide (PI), polyethylene terephthalate (PET), other suitable material or a combination thereof, but not limited thereto. In some embodiments, the substrate 110 may include a rigid substrate, a soft substrate or a flexible substrate.

Referring to FIG. 1, the display device 100 may include a circuit component layer 120 disposed on the substrate 110, and the circuit component layer 120 may include corresponding component(s) and/or corresponding structure(s) based on requirement(s). For example, the circuit component layer 120 may include switching component(s) SW, scan line(s) (not shown), auxiliary electrode(s) (not shown), data line (s) (not shown), any other required component (s) and/or any other required structure(s). The display device 100 may include an electroluminescence element EC disposed on the substrate 110, and the electroluminescence element EC may be electrically connected to the switching component SW. In some embodiments, the switching component SW may be a thin film transistor (TFT), wherein a gate of the switching component SW may be formed of a conductive layer ML1, a gate insulating layer of the switching component SW may be formed of an insulating layer IN1, a channel structure of the switching component SW may be formed of a semiconductor layer SM, and a source and/or a drain of the switching component SW may be formed of a conductive layer ML2. The drain (or the source) of the switching component SW may be connected to a first electrode E1 of the electroluminescence element EC, but not limited thereto. In another embodiment, the thin film transistor may include a top gate thin film transistor, a bottom gate thin film transistor and/or a dual gate (double gate) thin film transistor, but not limited thereto.

Referring to FIG. 1, in some embodiments, the electroluminescence element EC may include an organic light-emitting diode, an inorganic light-emitting diode (mini-LED or micro-LED), a quantum-dot light-emitting diode, other suitable light emitting component or a combination thereof, but not limited thereto. The electroluminescence element EC may emit blue light, white light, UV light or another light with suitable color based on requirement(s). the layer(s) contained in the electroluminescence element EC may be adjusted based on the color and/or the type of the electroluminescence element EC. In some embodiments, the electroluminescence element EC may be an organic light-emitting diode, the electroluminescence element EC may include a first electrode E1 (e.g., one of an anode or a cathode), a light emitting layer LE and/or a second electrode E2 (e.g., another one of the anode or the cathode), the light emitting layer LE is disposed between the first electrode E1 and the second electrode E2. In some embodiments, a plurality of first electrodes E1 may be separated from each other, and each first electrode E1 may correspond to one of the sub-pixels SPX. In some embodiments, a plurality of light emitting layers LE may be connected to each other to be a common layer (the common layer is referred as a common light-emitting layer hereinafter). In some embodiments, a plurality of second electrodes E2 may be connected to each other to be a common electrode layer, but not limited thereto. Note that, in FIG. 1, although the electroluminescence element EC is the common light-emitting layer, the luminous region of the common light-emitting layer may be a region overlapping the first electrode E1 and the second electrode E2. That is to say, in a top-view direction D, the common light-emitting layer may be divided into a plurality of luminous regions (not shown) to serve as the light emitting layers LE, each of these luminous regions is substantially a region overlapping the first electrode E1 and the second electrode E2, and these luminous regions may substantially correspond to different sub-pixels SPX. In some embodiments (not shown), the light emitting layer LE (or the second electrode E2) may be separated from each other, but not limited thereto. In some embodiments, the light emitting layer LE may include a single-layer structure or a multi-layer structure based on requirement(s). In some embodiments (not shown), the light emitting layer LE may include a hole injection layer, a hole transport layer, an active layer, an electron transport layer and/or an electron injection layer stacked on the first electrode E1 in sequence, but not limited thereto. The light emitting layer LE may include other suitable layer based on requirement(s).

Referring to FIG. 1, the electroluminescence element EC may be disposed on the switching component SW, and at least one insulating layer IN2 may be disposed between the conductive layer ML2 and the electroluminescence element EC (e.g., the first electrode E1). In some embodiments, the display device 100 may optionally include a pixel defining layer PDL, the pixel defining layer PDL may have a plurality of openings, at least portion of the light emitting layer LE and/or the second electrode E2 may be inside the opening of the pixel defining layer PDL, but not limited thereto. In some embodiments, the display device 100 may optionally include a protecting layer CPL, and the protecting layer CPL may be disposed on the electroluminescence element EC. In some embodiments, the protecting layer CPL may have flatting function. In some embodiments, the protecting layer CPL may include a single-layer structure or a multi-layer structure, and the protecting layer CPL may include an inorganic insulating layer, an organic insulating layer or a combination thereof, but not limited thereto.

Referring to FIG. 1, the display device 100 may include a partition structure LB disposed on the substrate 110. In FIG. 1, the partition structure LB is disposed on the electroluminescence element EC, but not limited thereto. In some embodiments, the partition structure LB may have a light-shielding function. For instance, the partition structure LB may include black photoresist, black ink, black resin, pigment, dye, other suitable material or a combination thereof. For instance, the partition structure LB is configured to shield the components (e.g., transistor(s) or trace(s)) under the partition structure LB, or configured to reduce the probability that the ambient light is reflected by the components (e.g., transistor(s) or trace(s)) of the display device 100, but not limited thereto. In some embodiments, the partition structure LB may have a plurality of openings OP, and the top-viewing shape of the sub-pixels SPX may be defined by the openings OP. In some embodiments, the partition structure LB may be configured to diminish the interference between the lights emitted by at least portion of the electroluminescence elements EC corresponding to the different sub-pixels SPX. In some embodiments, the partition structure LB may be configured to separate the sub-pixels SPX. In some embodiments, the partition structure LB may include a single-layer structure, a multi-layer structure or a composite layer structure.

Referring to FIG. 1, the display device 100 may include a light conversion element 130 disposed in the opening OP of the partition structure LB, the light conversion element 130 is corresponding to one of the sub-pixels SPX in the top-view direction D. In some embodiments, the light conversion element 130 is disposed on the electroluminescence element EC. In some embodiments, compared with the electroluminescence element EC, the light conversion element 130 is closer to a light-emitting surface of the display device 100. In some embodiments, the light conversion element 130 may be configured to convert the color of the incident light provided from the electroluminescence element EC. In some embodiments, the light conversion element 130 may include quantum dots material, fluorescence material, phosphor material, other suitable material or a combination thereof. In some embodiments, the electroluminescence element EC emits the light with a short wavelength (e.g., blue light, white light or UV light), and the emitting light may be converted into a light with different wavelength by the light conversion element 130. In some embodiments, the light conversion element 130a may be disposed in the green sub-pixel SPX1, and the light conversion element 130a may be configured to convert the incident light to a green light, but not limited thereto. In some embodiments, the light conversion element 130b may be disposed in the red sub-pixel SPX2, and the light conversion element 130b may be configured to convert the incident light to a red light, but not limited thereto. In some embodiments, the light conversion element 130c may be optionally disposed in the blue sub-pixel SPX3, and the light conversion element 130c may be configured to convert the incident light to a light with another wave band (e.g., a blue light with another wave band), but not limited thereto. In some embodiments, the light conversion element 130 may have a light-scattering effect (e.g., the light conversion element 130 may include light scattering particles). For instance, the electroluminescence element EC may emit the blue light, and the light conversion element 130c disposed in the blue sub-pixel SPX3 may include the light scattering particles, but not limited thereto.

Figure 2:
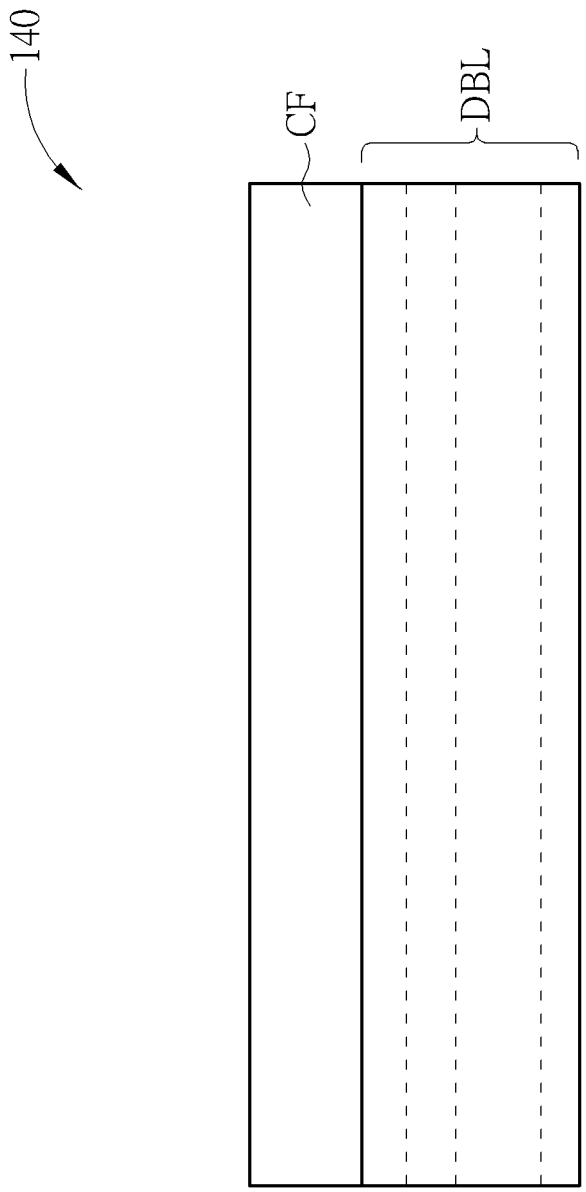
FIG. 2 is a schematic diagram showing a cross-sectional view of an optical element according to an embodiment of the present disclosure.

In some embodiments, an optical element 140 may include a color filter layer, a Bragg reflection layer, a light-scattering layer (e.g., the light-scattering layer may include light scattering particles) or a combination thereof, but not limited thereto. In some embodiments, the optical element 140 may include a single-layer structure or a multi-layer structure. For example, when the optical element 140 includes a color filter layer, the thickness of the optical element 140 may be in a range from 1 μm to 10 μm (1 μm≤the thickness≤10 μm), but not limited thereto. In some embodiments, the color filter layer corresponding to the green sub-pixel SPX1 may include green filter material, the color filter layer corresponding to the red sub-pixel SPX2 may include red filter material, the color filter layer corresponding to the blue sub-pixel SPX3 may include blue filter material, but not limited thereto. In some embodiments, the electroluminescence element EC may emit the blue light, the color filter layer corresponding to the green sub-pixel SPX1 and/or the color filter layer corresponding to the red sub-pixel SPX2 may include yellow filter material to filter the blue light, but not limited thereto. In some embodiments, the optical element 140 may include a Bragg reflection layer, the Bragg reflection layer is a multi-layer structure, wherein a refractive index difference between two adjacent layers of the multiple layers in the Bragg reflection layer may be designed, so as to enhance the probability that a light having a wavelength in a specific range passes through the Bragg reflection layer and/or to enhance the probability that a light having other wavelength (e.g., a light which is not converted) is reflected to the light conversion element 130, thereby increasing the light converting ratio. In some embodiments, the refractive index difference between two adjacent layers in the Bragg reflection layer may be greater than or equal to 0.3, but not limited thereto. In some embodiments, one of the layers in the Bragg reflection layer may include silicon oxide, hydrogenated silicon oxide ($SiO_x$:H), aluminum oxide or a combination thereof, another one of the layers in the Bragg reflection layer may include silicon nitride, hydrogenated silicon nitride ($SiN_x$:H), titanium oxide, tantalum oxide, zirconium oxide, niobium oxide, zinc oxide, yttrium oxide, cerium oxide or a combination thereof, and these two layers are adjacent to each other, but not limited thereto. In some embodiments, the Bragg reflection layer may be a multi-layer structure having such as 7 to 15 layers, and the total thickness may be in a range from about 2 nm to 9 nm (2 nm≤the total thickness≤9 nm), but not limited thereto. In some embodiments, as shown in FIG. 2, the optical element 140 may include a color filter layer CF and a Bragg reflection layer DBL (a multi-layer structure). In some embodiments (not shown), the color filter layer CF may be closer to the light-emitting surface of the display device 100 than the Bragg reflection layer DBL, wherein the light-emitting surface may be a viewing surface of the electronic device, but not limited thereto. In some embodiments (not shown), the Bragg reflection layer DBL may be closer to the light-emitting surface of the display device 100 than the color filter layer CF.

Referring to FIG. 1, the display device 100 may optionally include an intermediate layer 150 disposed on the light conversion element 130. In some embodiments, the intermediate layer 150 is disposed between the light conversion element 130 and the optical element 140. In some embodiments, in the top-view direction D, the intermediate layer 150 may overlap the light conversion element 130. In some embodiments, the intermediate layer 150 may cover the light conversion element 130. In some embodiments, the intermediate layer 150 may serve as a protecting layer to protect the light conversion element 130, such that the disadvantaged influence on the light conversion element 130 may be reduced during some manufacturing processes after forming the light conversion element 130 (e.g., a forming process of the optical element 140 or other layer(s)), but not limited thereto. In some embodiments, the intermediate layer 150 may have a flatting function. In some embodiments (not shown), the intermediate layer 150 may be divided into a plurality of portions, and these portions may respectively overlap different parts of the optical element 140 in the top-view direction D, but not limited thereto. In some embodiments, the material of the intermediate layer 150 may include silicon oxide, silicon nitride, polymer, polyimide, acrylic, other suitable organic material or a combination thereof, but not limited thereto. In some embodiments, the display device 100 may optionally include a protecting layer 160 disposed on the optical element 140, the protecting layer 160 is configured to protect component(s), structure(s) and/or layer(s) (e.g., the light conversion element 130 and/or the optical element 140) under the protecting layer 160, but not limited thereto. In some embodiments, the protecting layer 160 may include silicon oxide, silicon nitride, polymer, polyimide, acrylic, other suitable organic material or a combination thereof, but not limited thereto.

Referring to FIG. 1, in some embodiments, the display device 100 may optionally include an optical film, such as an anti-reflective layer 170, a polarizer PLZ, other optical film or a combination thereof. The optical film may be disposed at any suitable position. In some embodiments, the polarizer PLZ may be a wire-grid polarizer (WGP), but not limited thereto. In some embodiments, the anti-reflective layer 170 may be disposed on the protecting layer 160, the polarizer PLZ may be disposed on the anti-reflective layer 170 by an adhesive layer AL1, but not limited thereto.

Figure 3:
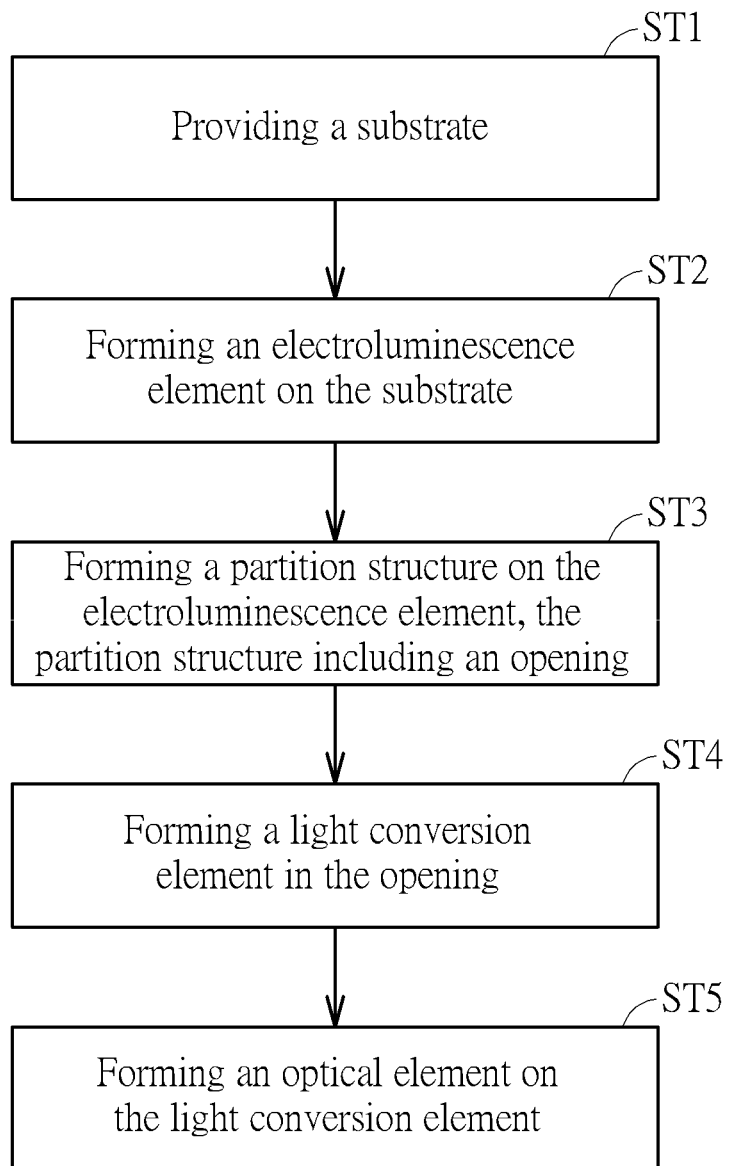
FIG. 3 is a flowchart of a method of manufacturing a display device according to an embodiment of the present disclosure.

Referring to FIG. 3, FIG. 3 is a flowchart of a method of manufacturing a display device according to an embodiment of the present disclosure. Note that the manufacturing method and the procedure described as below and shown in FIG. 3 are exemplary, and the manufacturing method and the procedure are not limited by the below content and FIG. 3. In some embodiments, the manufacturing method described as below and shown in FIG. 3 may be adjusted. For instance, some of the steps may be performed in a different order, some of the steps may be performed simultaneously, any step may be changed (e.g., a portion of step may be optionally removed) and/or any other suitable step may be added before, after or in one of the existing step of the method.

Regarding a step ST1 in FIG. 3, as shown in FIG. 1, the substrate 110 is provided. Details of the substrate 110 can be referred to the above.

Regarding a step ST2 in FIG. 3, as shown in FIG. 1, the electroluminescence element EC is formed on the substrate 110. In some embodiments, the electroluminescence element EC may be formed by coating, deposition, photolithography, transferring, other suitable process or a combination thereof. For instance, the circuit component layer 120 in FIG. 1 may be formed (or disposed) before the electroluminescence element EC is formed, but this step is omitted in FIG. 3.

Regarding a step ST3 in FIG. 3, as shown in FIG. 1, the partition structure LB is formed on the substrate 110 and/or the electroluminescence element EC, and the partition structure LB includes the opening OP. In some embodiments, the partition structure LB may be formed by coating, deposition, photolithography, other suitable process or a combination thereof.

Regarding a step ST4 in FIG. 3, as shown in FIG. 1, the light conversion element 130 is formed in the opening OP. The light conversion element 130 may be formed by coating, deposition or other suitable process. Other contents of the light conversion element 130 can be referred to the above, and these will not be redundantly described.

Regarding a step ST5 in FIG. 3, as shown in FIG. 1, the optical element 140 is formed on the light conversion element 130. The optical element 140 may be formed by coating, deposition, photolithography, transferring, printing, other suitable process or a combination thereof.

Figure 4:
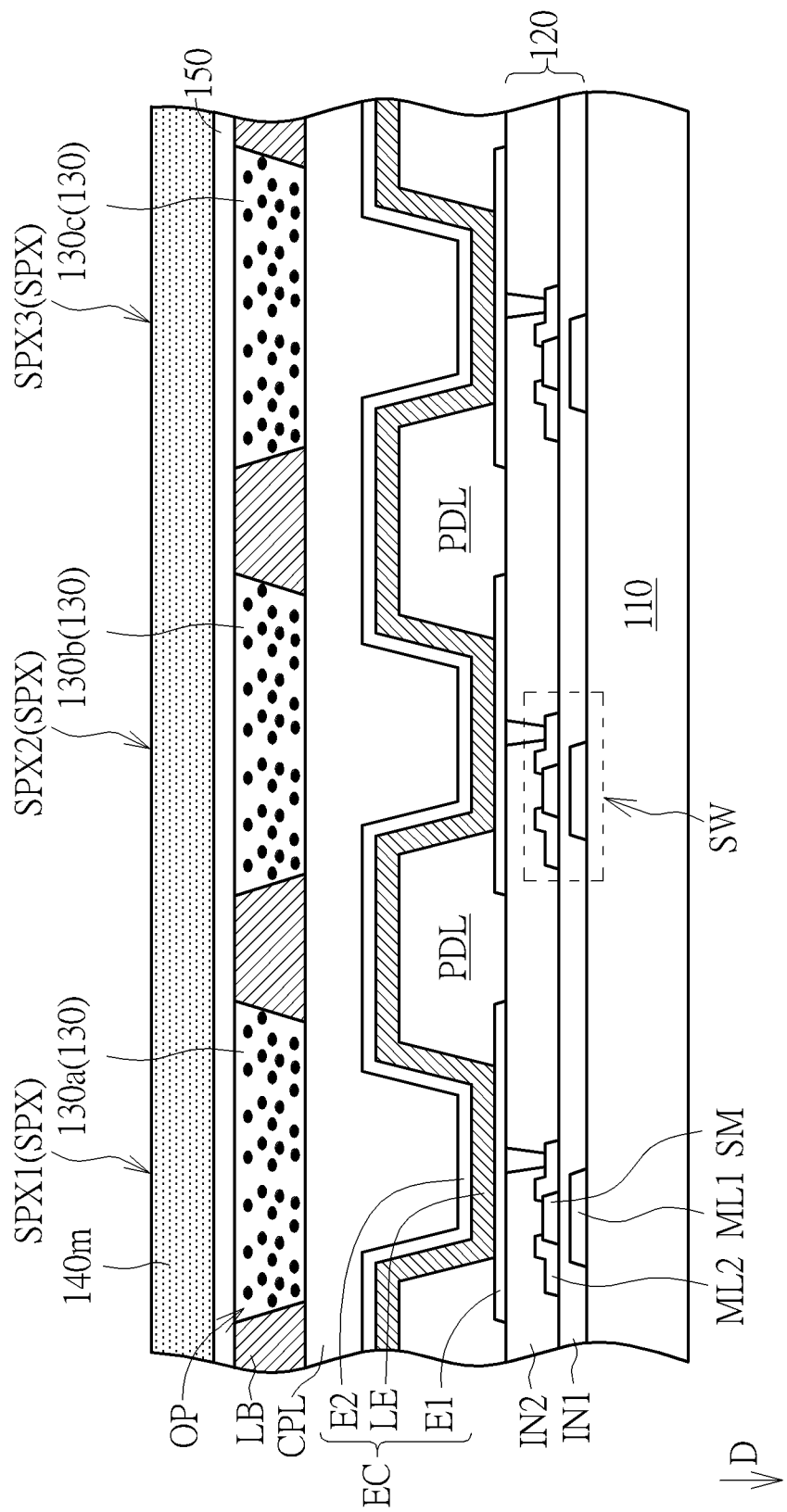
FIG. 4 and FIG. 5 are schematic diagrams showing a forming process of an optical element according to the first embodiment of the present disclosure.
Figure 5:
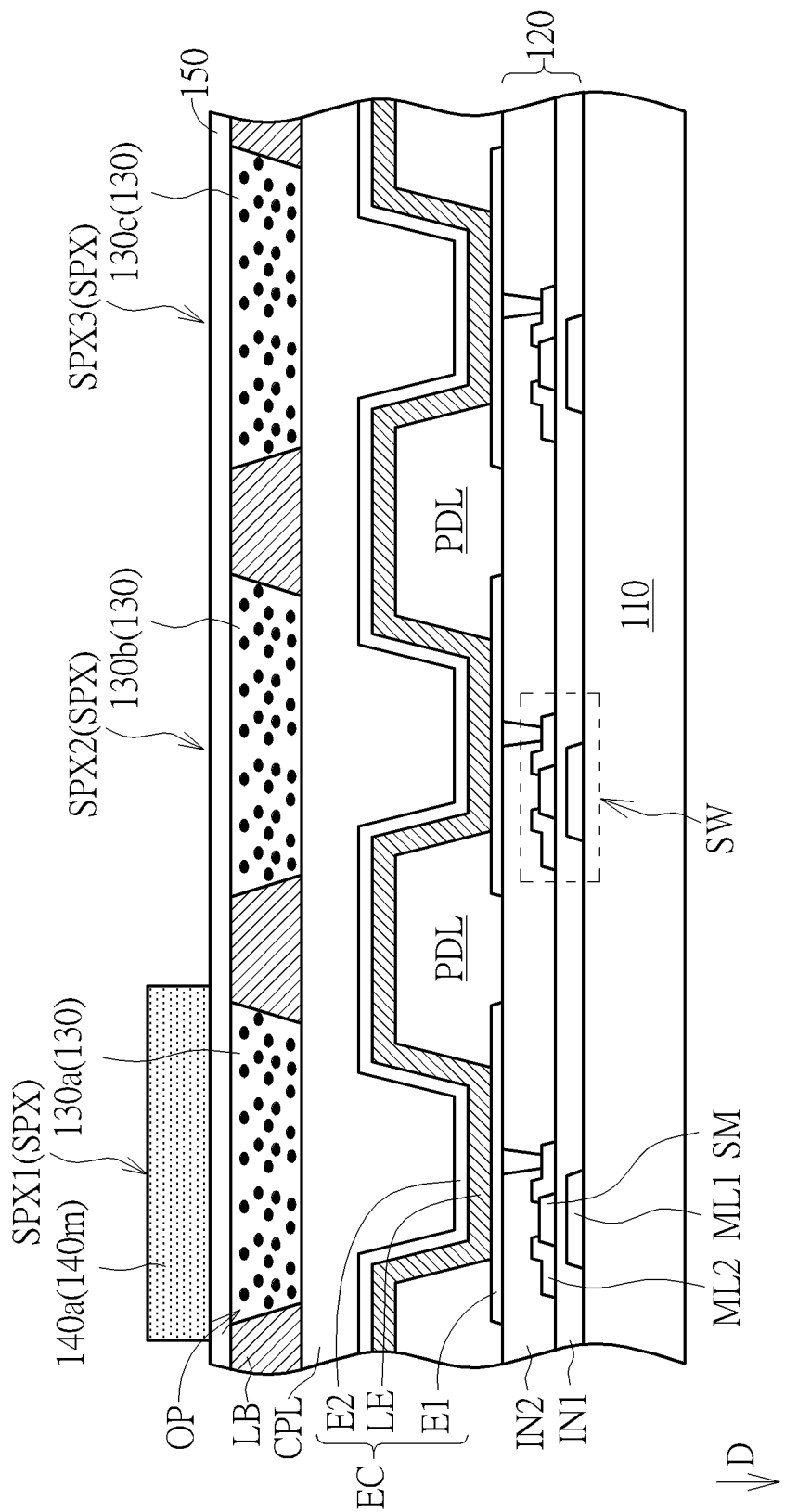

Referring to FIG. 4 and FIG. 5, FIG. 4 and FIG. 5 are schematic diagrams showing a forming process of an optical element according to the first embodiment of the present disclosure. As shown in FIG. 4, an optical element material layer 140m may be formed on the light conversion element 130 by coating, deposition, other suitable process or a combination thereof. Then, as shown in FIG. 5, for instance, the photolithography is performed on the optical element material layer 140m to form a patterned optical element 140a, but not limited thereto. For example, in the photolithography, a patterned blocking layer (not shown) may be formed on the optical element material layer 140m which is not patterned, this blocking layer may cover a portion of the optical element material layer 140m, and the optical element material layer 140m may be patterned to be the optical element 140a by etching and removing another portion of the optical element material layer 140m which is not covered by the blocking layer. Hereafter, the patterned blocking layer is removed to complete the photolithography. In some embodiments, the optical element material layer 140m is a filter layer or a color resist, a portion of the filter layer or a portion of the color resist may be kept by exposure and/or development, and the portion of the filter layer or the portion of the color resist is the optical element 140a, but not limited thereto. Similarly, the optical element 140b (not shown in FIG. 4 and FIG. 5) and/or other optical element (not shown) may be formed by similar process, but not limited thereto. In some embodiments, the optical element 140a and/or the optical element 140b include yellow filter material, the optical element 140a and the optical element 140b may be formed by the same process, but not limited thereto. Other contents of the optical element 140 can be referred to the above, and these will not be redundantly described.

According to the display device 100 shown in FIG. 1, the manufacturing method may include a step of forming the intermediate layer 150 on the light conversion element 130. In some embodiments (as shown in FIG. 1), the intermediate layer 150 may be formed or disposed after the light conversion element 130 is formed and before the optical element 140 is formed, but not limited thereto. In some embodiments, the intermediate layer 150 may be formed by coating, deposition, photolithography, adhering, other suitable process or a combination thereof. For example, the intermediate layer 150 shown in FIG. 1 may be formed by coating, but not limited thereto.

The display device and the method of manufacturing the display device of the present disclosure are not limited to the above embodiment(s). Further embodiments of the present disclosure are described below. For ease of comparison, same components will be labeled with the same symbol in the following. The following descriptions relate the differences between each of the embodiments, and repeated parts will not be redundantly described.

Note that, in the following embodiments, the figures omit the blue sub-pixel SPX3 and only show the green sub-pixel SPX1 and the red sub-pixel SPX2 to make the figures simple and clear. Furthermore, the figures show the electroluminescence element EC and the pixel defining layer PDL and omit other components and/or structures to make the figures simple and clear.

Figure 6:
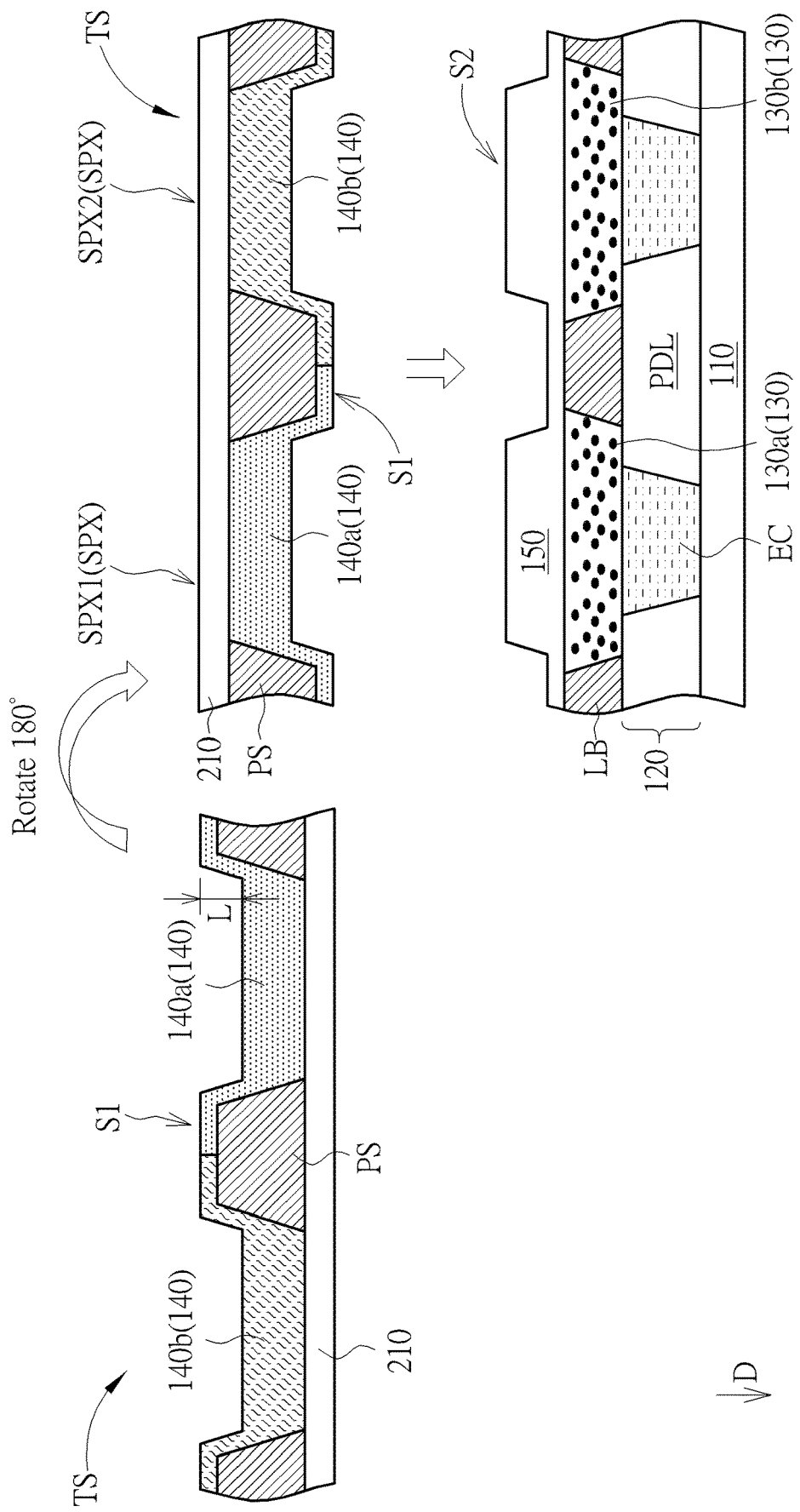
FIG. 6 is a schematic diagram showing a forming process of an optical element according to a second embodiment of the present disclosure.
Figure 7:
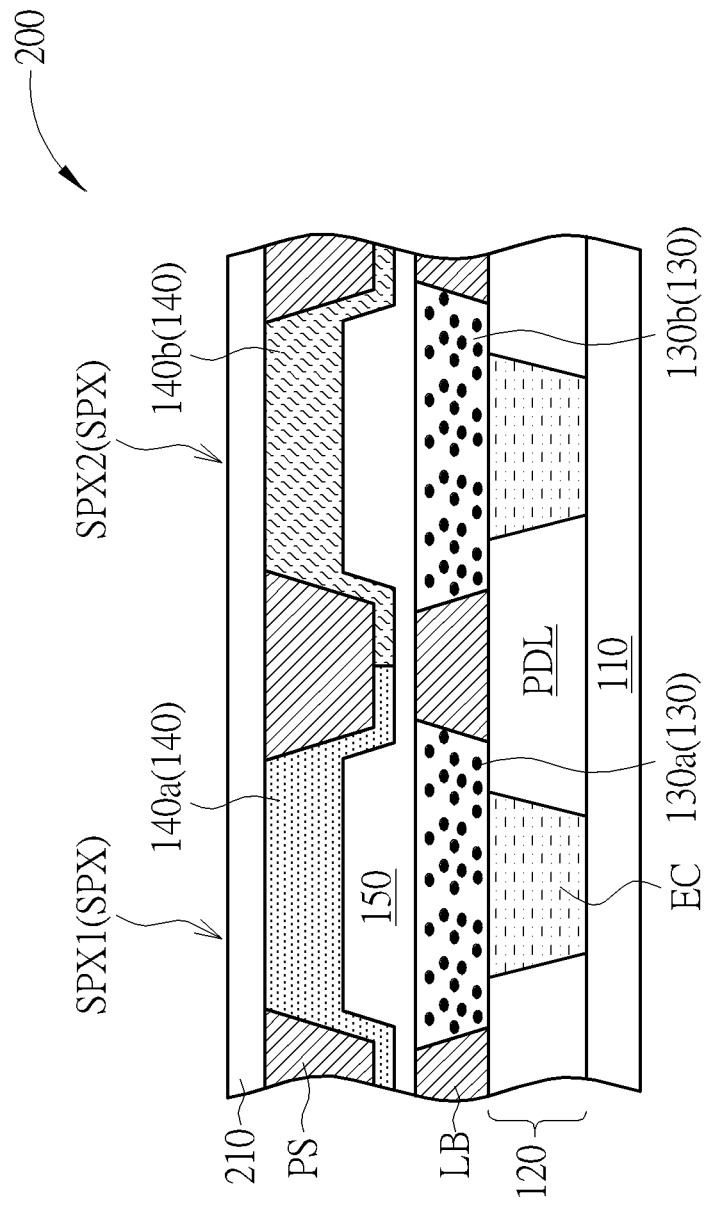
FIG. 7 is a schematic diagram showing a cross-sectional view of a display device according to the second embodiment of the present disclosure.

Referring to FIG. 6 and FIG. 7, FIG. 6 is a schematic diagram showing a forming process of an optical element according to a second embodiment of the present disclosure, and FIG. 7 is a schematic diagram showing a cross-sectional view of a display device according to the second embodiment of the present disclosure. As shown in FIG. 6 and FIG. 7, compared with the first embodiment, the optical element 140 is formed by a transferring process. In detail, in FIG. 6 (left side), a transferring substrate 210 is provided, and the optical element 140 is formed on the transferring substrate 210 to form a transferring structure TS. Then, by the transferring process (as shown on right side of FIG. 6), the transferring structure TS is disposed on the light conversion element 130 after the transferring structure TS is rotated 180° (i.e., the transferring structure TS is turned upside down) to complete the transferring process (as shown in FIG. 7), but not limited thereto. In some embodiments (as shown in FIG. 6 and FIG. 7), the transferring structure TS may be fixed on the substrate 110 by an anchoring force, but not limited thereto. In some embodiments, the transferring structure TS has a microstructure surface S1 including a protrusion and a recess, and the layer (e.g., the intermediate layer 150) on the substrate 110 may have a microstructure surface S2 including a protrusion and a recess, the microstructure surface S2 is substantially complementary to the microstructure surface S1 to increase the fixing effect between the layer (e.g., the intermediate layer 150) on the substrate 110 and the transferring structure TS, but not limited thereto. For instance, the protrusion of the transferring structure TS may be substantially corresponding to the recess of the layer (e.g., the intermediate layer 150), the recess of the transferring structure TS may be substantially corresponding to the protrusion of the layer (e.g., the intermediate layer 150), wherein the term "corresponding" described here may represent two element are overlapped with each other in the top-view direction D, but not limited thereto. In some embodiments, the recess of the transferring structure TS may be substantially complementary to the protrusion of the layer (e.g., the intermediate layer 150). In some embodiments, the transferring structure TS may optionally include a protrusion structure PS disposed on the transferring substrate 210, such that the transferring structure TS has the microstructure surface S1 including the protrusion and the recess, and the intermediate layer 150 on the substrate 110 may have the microstructure surface S2 substantially complementary to the microstructure surface S1, but not limited thereto. For example, a height difference L of the microstructure surface S1 may be in a range from 1 μm to 5 μm (1 μm to height difference L 5 μm) or be in a range from 1.5 μm to 4 μm (1.5 μm height difference L 4 μm), but not limited thereto. For example, the height difference L is the maximum height difference of the microstructure surface S1 under a cross section of the transferring structure TS. In some embodiments (as shown in FIG. 6 and FIG. 7), the protrusion structure PS may be disposed between the optical element 140 and the transferring substrate 210.

Moreover, in the transferring process, the transferring substrate 210 may be removed or not be removed based on requirement (s). In FIG. 6 and FIG. 7, the transferring substrate 210 is not removed, and the transferring substrate 210 may serve as the protecting layer (referring to the protecting layer 160 in FIG. 1 and the above content describing the protecting layer 160), but not limited thereto. In some embodiments (not shown), before the optical element 140 is formed, a buffer layer may be formed on the transferring substrate 210 (i.e., the buffer layer is between the transferring substrate 210 and the optical element 140) to increase the reliability of the optical element 140. In some embodiments (not shown), the buffer layer is not removed during the transferring process, the buffer layer may serve as a protecting layer. For example, the buffer layer may include any suitable organic material or other suitable material, but not limited thereto. In addition, after the transferring process is completed, the optical film, the protecting layer, other suitable layer or a combination thereof may be disposed on the optical element 140 based on requirement(s).

Figure 8:
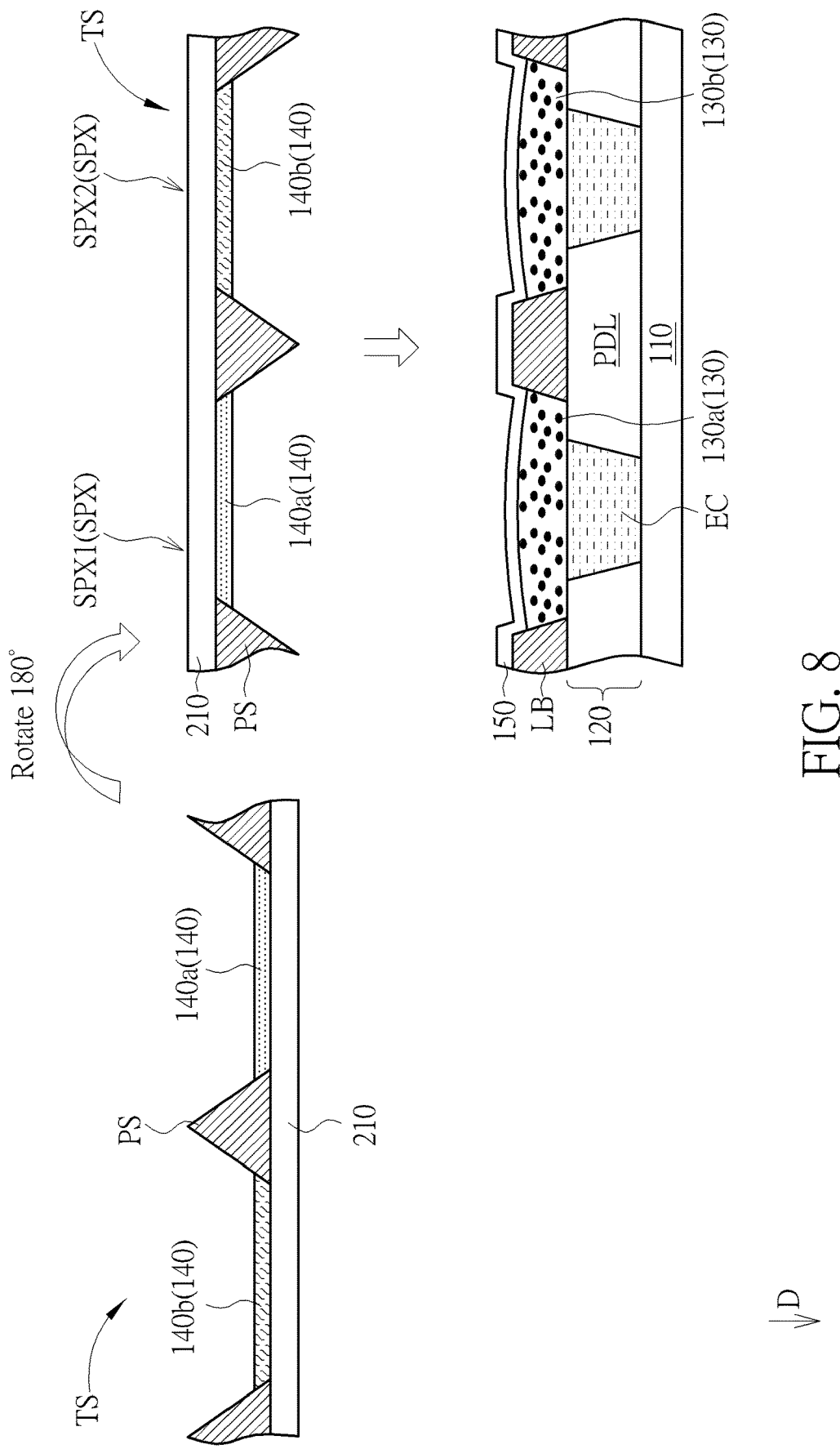
FIG. 8 is a schematic diagram showing a forming process of an optical element according to a third embodiment of the present disclosure.

Referring to FIG. 8, FIG. 8 is a schematic diagram showing a forming process of an optical element according to a third embodiment of the present disclosure. As shown in FIG. 8, compared with the second embodiment, the cross-sectional shape of the protrusion structure PS of this embodiment is a triangle. For example, in the transferring process, the protrusion structure PS may be embedded in at least one layer on the substrate 110 and may be fixed by the anchoring force, but not limited thereto. For instance, the protrusion structure PS may be embedded in a portion of the intermediate layer 150 and/or a portion of the partition structure LB, but not limited thereto. In some embodiments (not shown), the intermediate layer 150 may be disposed or not be disposed optionally. Moreover, after the transferring process is completed, the optical film, the protecting layer, other suitable layer or a combination thereof may be disposed on the optical element 140 based on requirement(s). In some embodiments, the optical element 140 and the protrusion structure PS may be disposed on the transferring substrate 210, and the optical element 140 and the protrusion structure PS are in contact with the transferring substrate 210, but not limited thereto. In some embodiments, the protrusion structure PS may have any suitable cross-sectional shape, such as a triangle, a quadrangle, a trapezoid or other suitable shape. In some embodiments, the material of the protrusion structure PS may have a light-blocking function. The material of the protrusion structure PS may be changed based on requirement(s).

Figure 9:
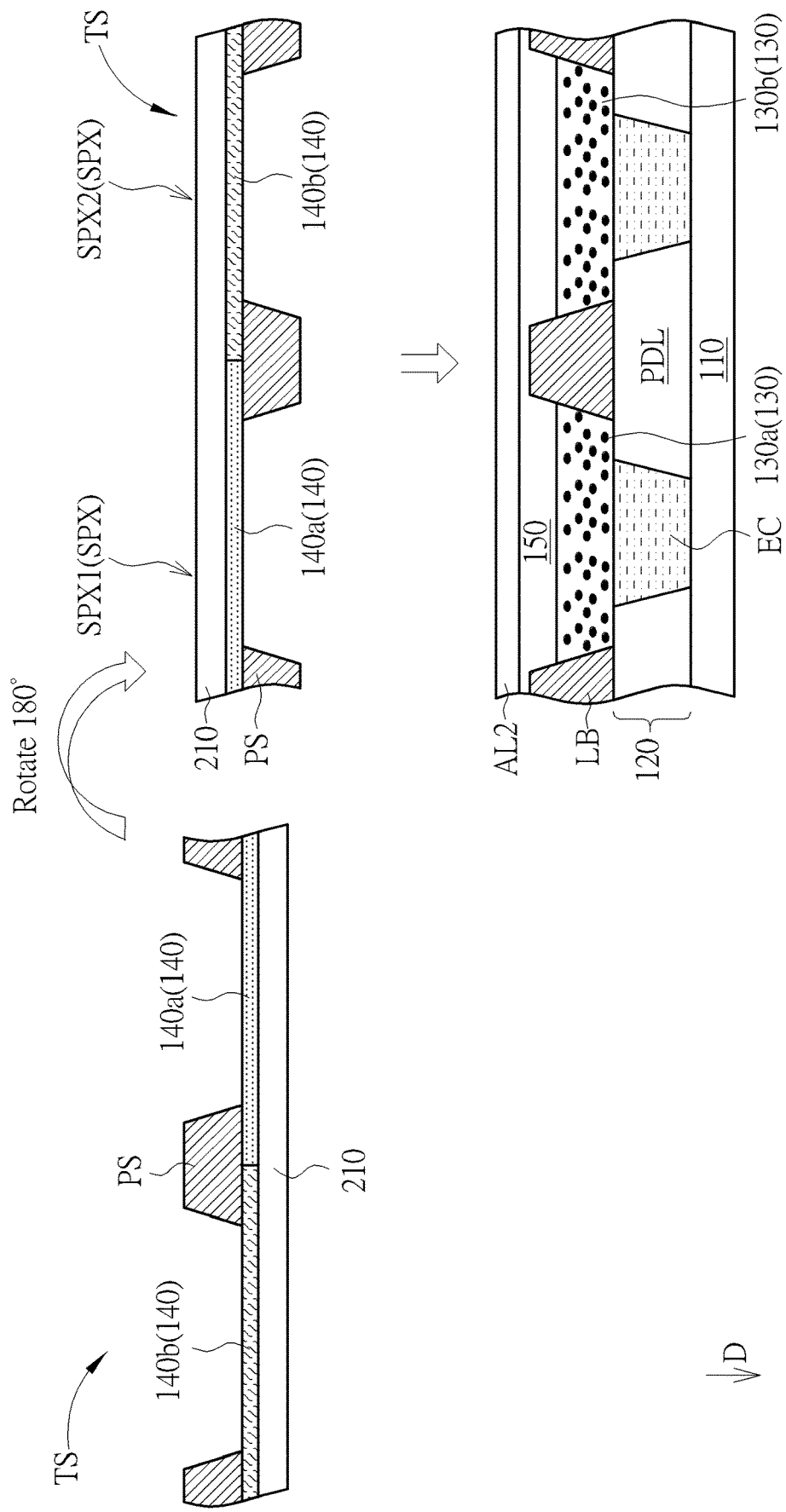
FIG. 9 is a schematic diagram showing a forming process of an optical element according to a fourth embodiment of the present disclosure.
Figure 10:
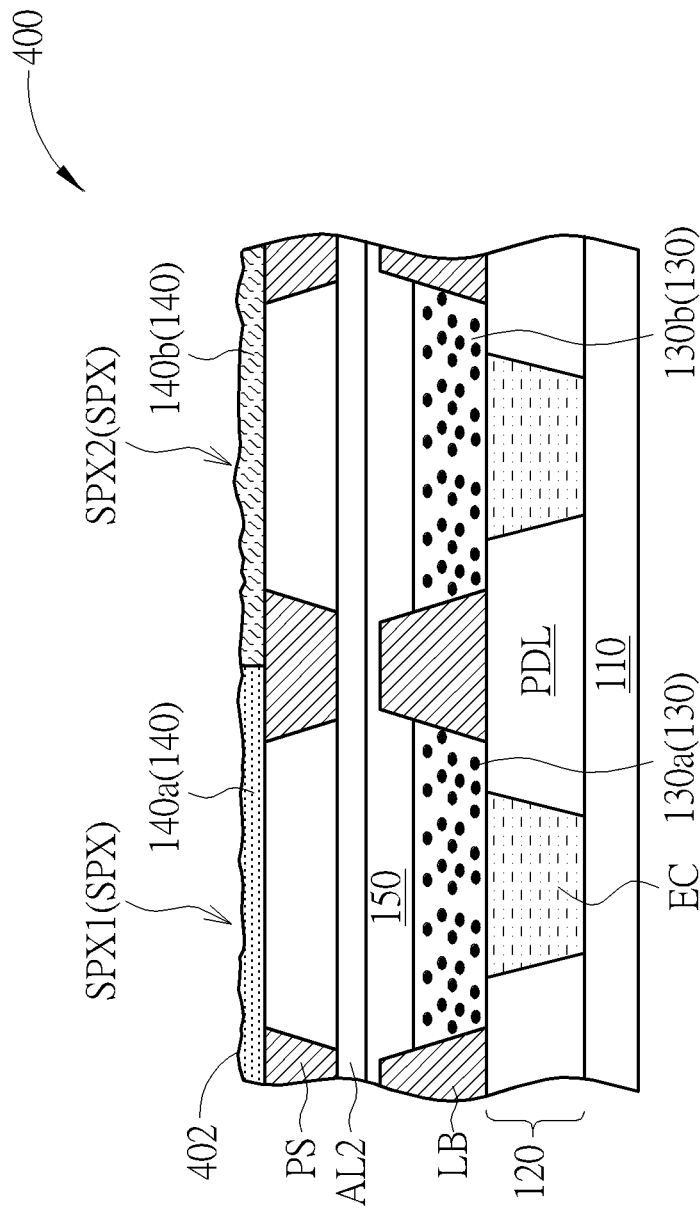
FIG. 10 is a schematic diagram showing a cross-sectional view of a display device according to the fourth embodiment of the present disclosure.

Referring to FIG. 9 and FIG. 10, FIG. 9 is a schematic diagram showing a forming process of an optical element according to a fourth embodiment of the present disclosure, and FIG. 10 is a schematic diagram showing a cross-sectional view of a display device according to the fourth embodiment of the present disclosure. As shown in FIG. 9 and FIG. 10, compared with the second embodiment, the transferring structure TS may be fixed by an adhesive layer AL2 disposed on the light conversion element 130. In some embodiments (as shown in FIG. 9 and FIG. 10), the adhesive layer AL2 may optionally adhere to the transferring structure TS (e.g., the protrusion structure PS and/or the optical element 140) or the intermediate layer 150. In some embodiments (not shown), the transferring structure TS may not have the protrusion structure PS. In some embodiments, the optical element 140 may be disposed between the protrusion structure PS and the transferring substrate 210.

In FIG. 9 and FIG. 10, in the transferring process, the transferring substrate 210 may be removed. For example, the transferring substrate 210 may be removed by laser or other suitable method, but not limited thereto. In some embodiments, the transferring substrate 210 may be removed before or after the optical element 140 is disposed on the light conversion element 130 (e.g., by adhering, anchoring, etc.), but not limited thereto. As shown in FIG. 10, in the display device 400, the transferring substrate 210 is removed, the display device 400 has a surface 402 which is such as an uneven surface, and the surface 402 is configured to enhance the light-scattering effect, but not limited thereto. In FIG. 10, the optical film, the protecting layer, other suitable layer or a combination thereof may be disposed on the optical element 140 based on requirement(s).

Figure 11:
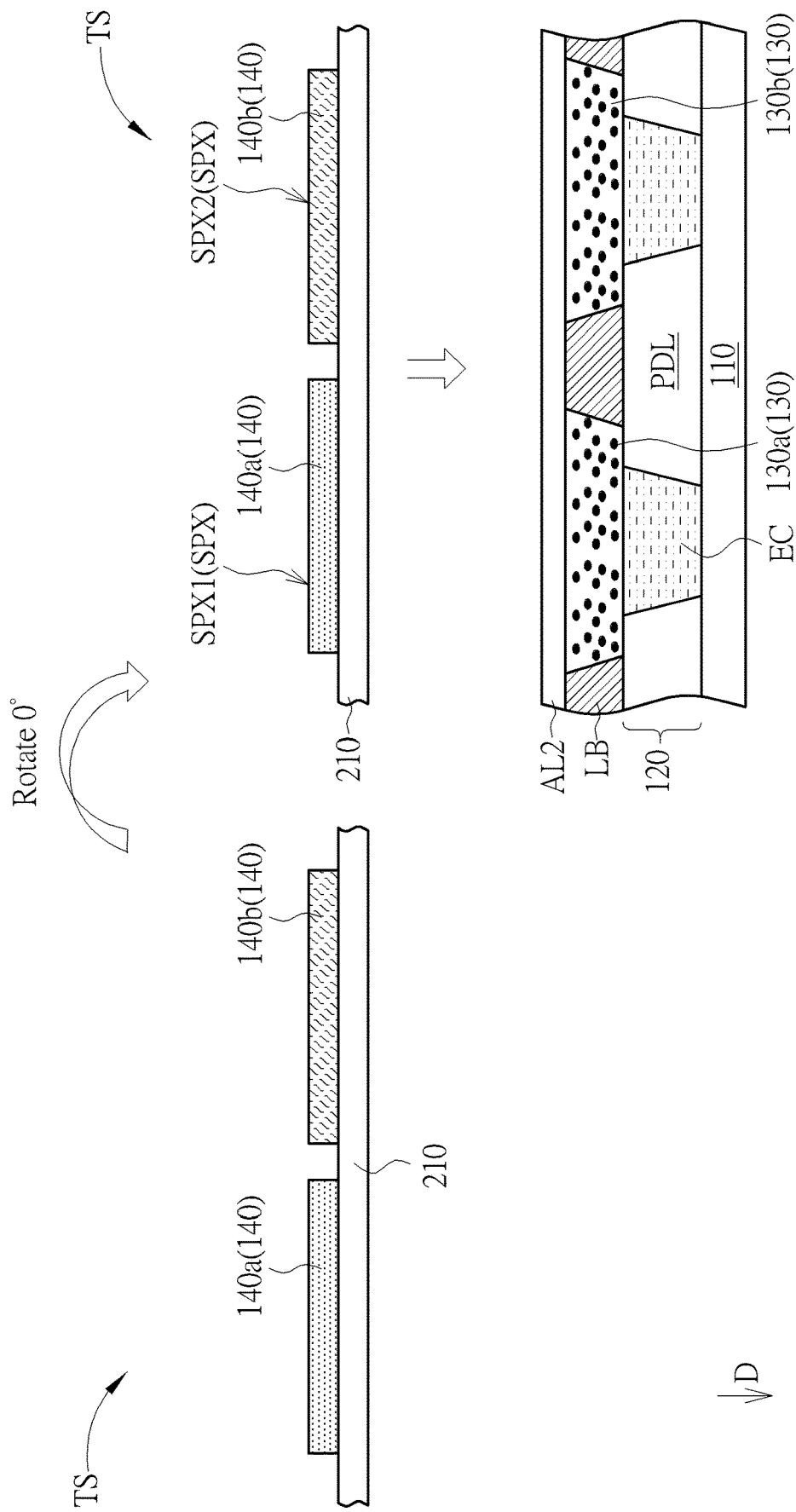
FIG. 11 is a schematic diagram showing a forming process of an optical element according to a fifth embodiment of the present disclosure.

Referring to FIG. 11, FIG. 11 is a schematic diagram showing a forming process of an optical element according to a fifth embodiment of the present disclosure. As shown in FIG. 11, compared with the second embodiment, the transferring structure TS may be fixed by an adhesive layer AL2 disposed on the light conversion element 130. In FIG. 11, in the transferring process, the transferring structure TS is not rotated and disposed on the adhesive layer AL2. Namely, the adhesive layer AL2 may adhere to the transferring substrate 210, and the transferring substrate 210 may be between the light conversion element 130 and the optical element 140. In this embodiment, the transferring substrate 210 may have a protecting function. In some embodiments (not shown), a buffer layer may be optionally disposed between the optical element 140 and the transferring substrate 210, the transferring substrate 210 and/or the buffer layer may serve as the intermediate layer of the present disclosure. In some embodiments, the transferring structure TS may not have the protrusion structure PS, but not limited thereto. Moreover, after the transferring process is completed, the optical film, the protecting layer, other suitable layer or a combination thereof may be disposed on the optical element 140 based on requirement(s).

Figure 12:
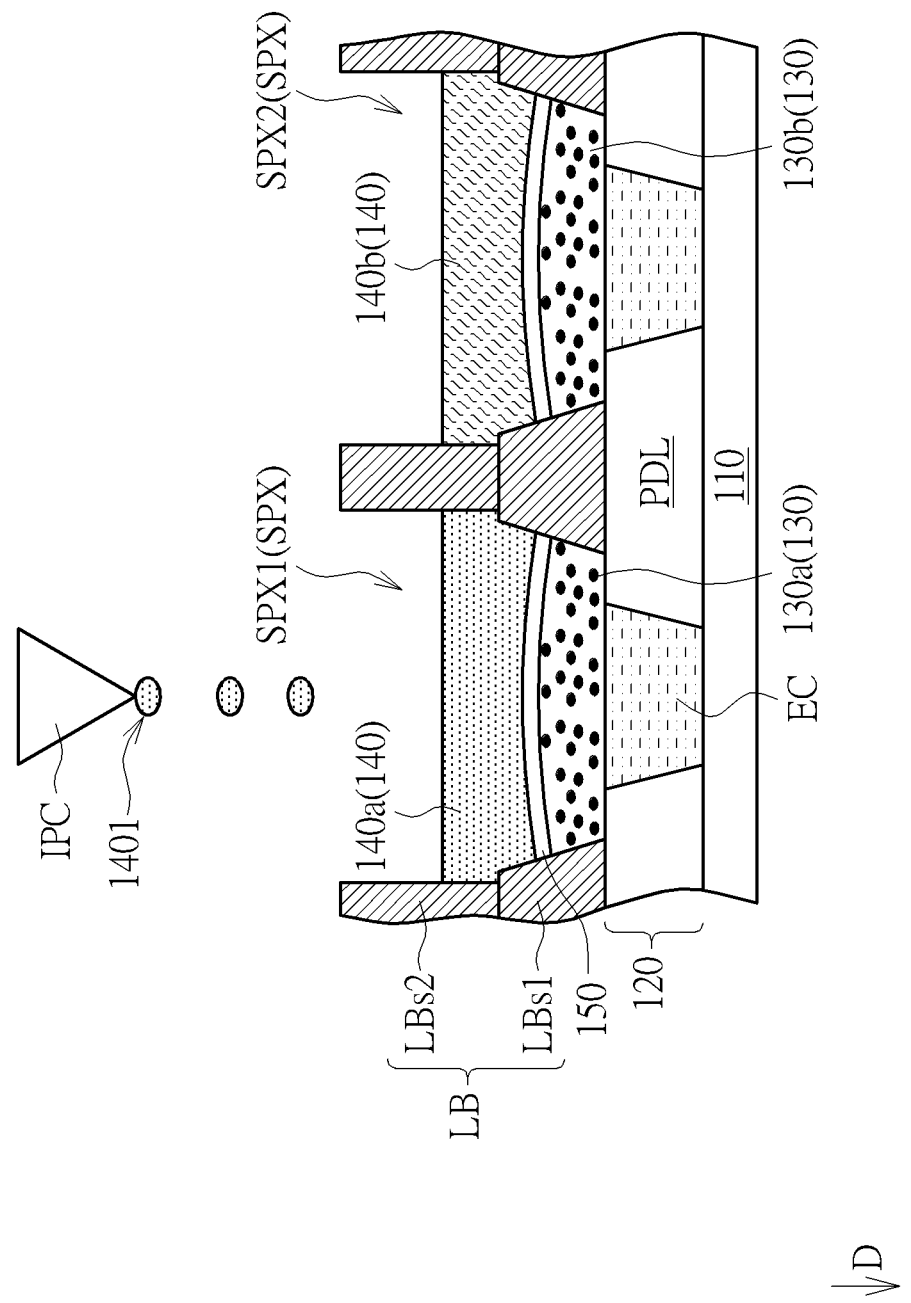
FIG. 12 is a schematic diagram showing a forming process of an optical element according to a sixth embodiment of the present disclosure.
Figure 13:
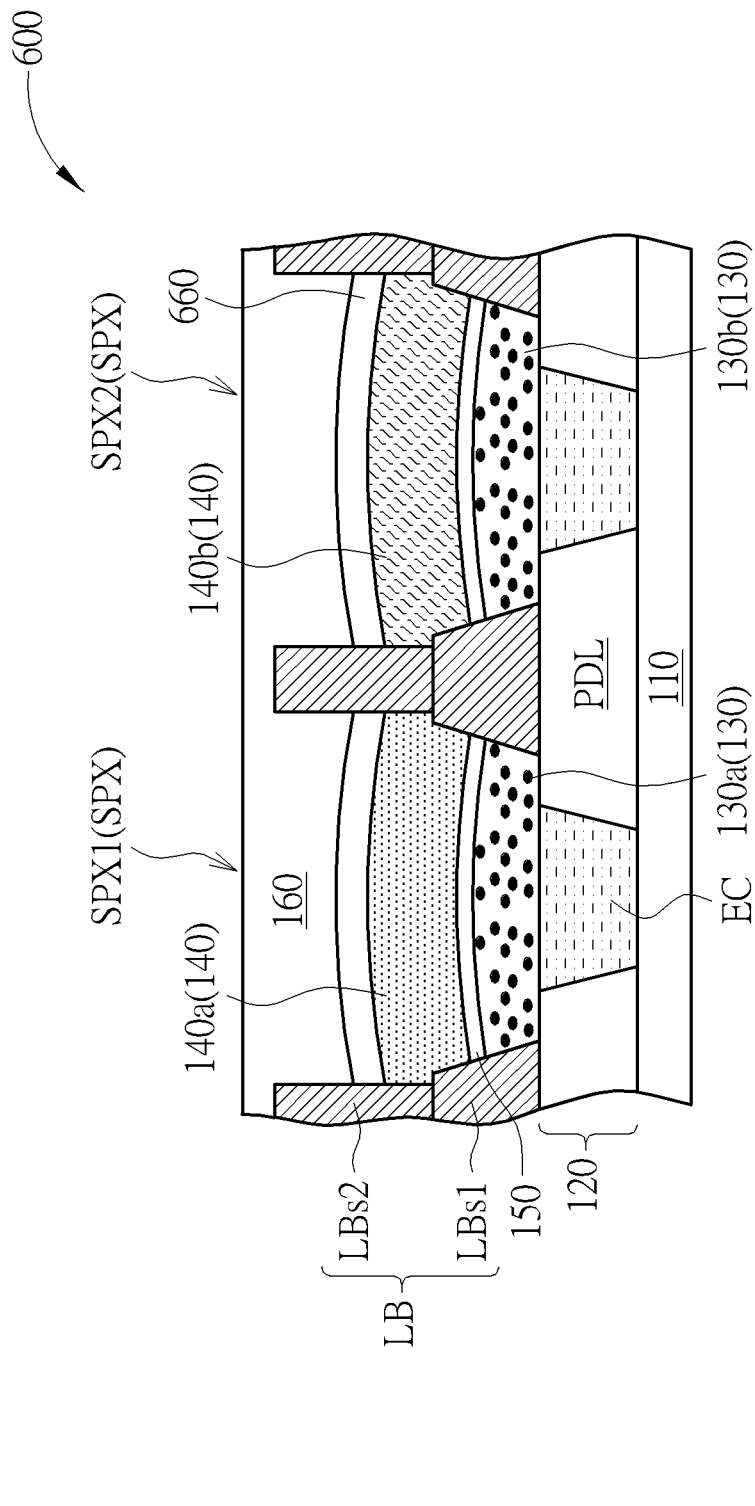
FIG. 13 is a schematic diagram showing a cross-sectional view of a display device according to the sixth embodiment of the present disclosure.

Referring to FIG. 12 and FIG. 13, FIG. 12 is a schematic diagram showing a forming process of an optical element according to a sixth embodiment of the present disclosure, and FIG. 13 is a schematic diagram showing a cross-sectional view of a display device according to the sixth embodiment of the present disclosure. As shown in FIG. 12 and FIG. 13, compared with the first embodiment, in the display device 600 of this embodiment, the optical element 140 is formed by a printing process. In some embodiments (as shown in FIG. 12), the optical element 140 is formed by ink-jet printing, but not limited thereto. In detail, in the forming process of the optical element 140, an inkjet component IPC may jet optical material 1401, wherein the optical material 1401 may include a color resist, but not limited thereto. Then, the optical material 1401 may be cured (e.g., by a heating process) to form the optical element 140. In FIG. 12, the optical material 1401 is formed by ink-jet printing, the partition structure LB may be higher to reduce the probability that the optical material 1401 flows to an undesired sub-pixels SPX for affecting the yield rate, but not limited thereto. In some embodiments, the partition structure LB may include a multi-layer structure having a sub-partition part LBs1 and a sub-partition part LBs2 to increase the height of the partition structure LB. In some embodiments (not shown), the partition structure LB may include a single-layer structure, and this partition structure LB may have a suitable height.

In some embodiments (not shown), the optical element 140 may be formed by screen printing. For instance, in the forming process of the optical element 140, a mesh stencil may be disposed on the light conversion element 130, and each hole of the mesh stencil may respectively expose a position corresponding to the light conversion element 130a (i.e., the optical element 140a is disposed at the position). Then, the optical material 1401 is poured on the mesh stencil, and the optical material 1401 may pass through the holes of the mesh stencil to be disposed on the light conversion element 130a by a pressuring process and/or a curing process. Next, the mesh stencil is removed to complete the formation of the optical element 140a. Similarly, other optical element (e.g., the optical element 140b) may be disposed by similar method.

Referring to FIG. 13, a covering layer 660 and/or a protecting layer 160 may be disposed on the optical element 140, wherein the covering layer 660 may be between the protecting layer 160 and the optical element 140 for instance. In some embodiments, the covering layer 660 may be disposed in the opening OP of the partition structure LB. In some embodiments, the material of the covering layer 660 may include silicon oxide, silicon nitride, other suitable material or a combination thereof. In FIG. 12 and FIG. 13, the intermediate layer 150 may be disposed in the opening OP of the partition structure LB, but not limited thereto.

Figure 14:
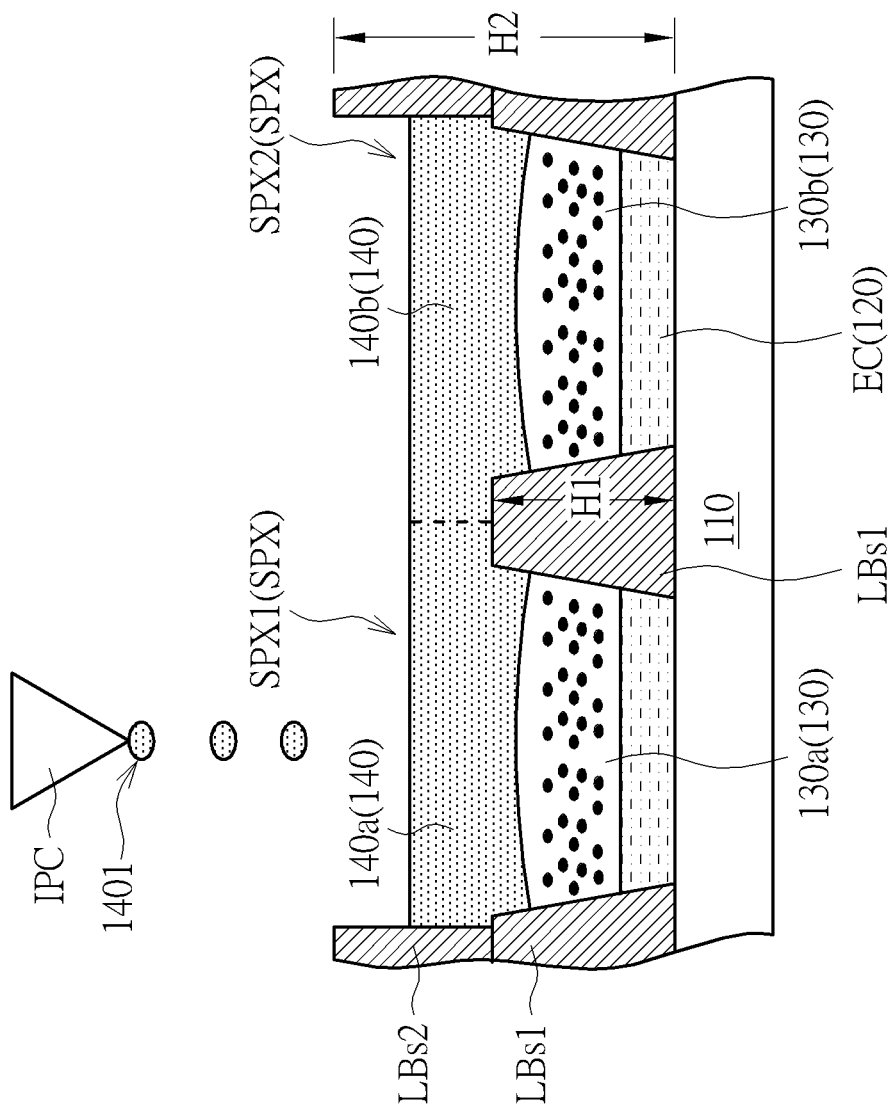
FIG. 14 is a schematic diagram showing a forming process of an optical element according to a seventh embodiment of the present disclosure.

Referring to FIG. 14, FIG. 14 is a schematic diagram showing a forming process of an optical element according to a seventh embodiment of the present disclosure. As shown in FIG. 14, compared with the sixth embodiment, the optical element 140a and the optical element 140b of this embodiment may include the same material, such as yellow resist. Therefore, in the ink-jet printing process, the optical element 140a and the optical element 140b may be respectively formed on the regions corresponding to the green sub-pixel SPX1 and the red sub-pixel SPX2 simultaneously. In some embodiments, the height H1 of the partition structure LB disposed between the green sub-pixel SPX1 and the red sub-pixel SPX2 may be less than the height H2 of other partition structure LB disposed at other position to simultaneously form the optical element 140a and the optical element 140b easily. For instance, in FIG. 14, the partition structure LB disposed between the green sub-pixel SPX1 and the red sub-pixel SPX2 may be a single-layer structure including the sub-partition part LBs1, and the partition structure LB disposed at other position may be a multi-layer structure including the sub-partition part LBs1 and the sub-partition part LBs2, the partition structures LB may have different heights, but not limited thereto.

Moreover, in FIG. 14, the electroluminescence elements EC may be separated from each other by the partition structure LB. In other words, the electroluminescence element EC is disposed in the opening OP of the partition structure LB, but not limited thereto. In some embodiments, the partition structure LB may be formed before the electroluminescence element EC is formed, and the electroluminescence element EC may be formed in the opening OP of the partition structure LB, but not limited thereto. In some embodiments (not shown, the pixel defining layer (referring to the above) and the partition structure LB may be the same component, and the pixel defining layer may serve as the partition structure LB and has a light-blocking function, but not limited thereto. Optionally, in FIG. 14, the intermediate layer disposed between the optical element 140 and the light conversion element 130 may not be included.

In summary, according to the method of manufacturing the display device of the disclosure, the display device having high display quality and/or high reliability may be manufactured. For instance, the damage of the light conversion element may be reduced (e.g., a swelling phenomenon and/or a quenching phenomenon on material may be reduced), the damage of the optical element may be reduced, and/or the color purity of the display device may be increased.

Although the embodiments and their advantages of the present disclosure have been described as above, it should be understood that any person having ordinary skill in the art can make changes, substitutions, and modifications without departing from the spirit and scope of the present disclosure. In addition, the protecting scope of the present disclosure is not limited to the processes, machines, manufactures, material compositions, devices, methods and steps in the specific embodiments described in the description. Any person having ordinary skill in the art can understand the current or future developed processes, machines, manufactures, material compositions, devices, methods and steps from the content of the present disclosure, and then, they can be used according to the present disclosure as long as the same functions can be implemented or the same results can be achieved in the embodiments described herein. Thus, the protecting scope of the present disclosure includes the above processes, machines, manufactures, material compositions, devices, methods and steps. Moreover, each claim constitutes an individual embodiment, and the protecting scope of the present disclosure also includes the combination of each claim and each embodiment. The protecting scope of the present disclosure shall be determined by the appended claims.

What is claimed is:

1. A display device, comprising:
a substrate;
an electroluminescence element disposed above the substrate;
a partition structure disposed above the electroluminescence element and comprising a first opening;
a light conversion element disposed in the first opening; and
an intermediate layer disposed above the light conversion element and the partition structure;
wherein the intermediate layer has a first part and a second part;
wherein in a top-view direction, the first part overlaps the light conversion element, the second part overlaps the partition structure, and a thickness of the first part is greater than a thickness of the second part.

2. The display device of claim 1, wherein in the top-view direction, the second part does not overlap the light conversion element.

3. The display device of claim 1, further comprising an optical element disposed above the intermediate layer, wherein in the top-view direction, the optical element overlaps the light conversion element,
wherein in a cross-section of the display device, a maximum width of the optical element is greater than a maximum width of the light conversion element.

4. The display device of claim 1, wherein the partition structure includes a light-shielding material.

5. The display device of claim 1, further comprising a protecting layer disposed between the electroluminescence element and the partition structure.

6. The display device of claim 1, further comprising a pixel defining layer disposed above the substrate and having a second opening, wherein a part of the electroluminescence element is disposed in the second opening, and the pixel defining layer overlaps the partition structure in the top-view direction.

7. The display device of claim 1, further comprising a pixel defining layer disposed above the substrate and having a second opening, wherein a part of the electroluminescence element is disposed in the second opening, wherein in a cross-section of the display device, a first minimum width of the first opening of the partition structure is different from a second minimum width of the second opening.

8. The display device of claim 7, wherein in the cross-section of the display device, the first minimum width of the first opening of the partition structure is greater than the second minimum width of the second opening.

9. The display device of claim 1, wherein the intermediate layer is in contact with the light conversion element.

10. The display device of claim 1, wherein a surface of the intermediate layer away from the substrate is a curved surface, and a surface of the light conversion element away from the substrate is a curved surface.

11. A display device, comprising:
a substrate;
another substrate disposed opposite to the substrate;
an electroluminescence element disposed between the substrate and the another substrate;
a partition structure disposed between the electroluminescence element and the another substrate, wherein the partition structure comprises a first opening;
a light conversion element disposed in the first opening; and
an intermediate layer disposed between the light conversion element and the another substrate;

wherein the intermediate layer has a first part and a second part;

wherein in a top-view direction, the first part overlaps the light conversion element, the second part overlaps the partition structure, and a thickness of the first part is greater than a thickness of the second part.

12. The display device of claim 11, wherein in the top-view direction, the second part does not overlap the light conversion element.

13. The display device of claim 11, further comprising an optical element disposed between the intermediate layer and the another substrate, wherein in the top-view direction, the optical element overlaps the light conversion element, wherein in a cross-section of the display device, a maximum width of the optical element is greater than a maximum width of the light conversion element.

14. The display device of claim 11, wherein the partition structure includes a light-shielding material.

15. The display device of claim 11, further comprising a protecting layer disposed between the electroluminescence element and the partition structure.

16. The display device of claim 11, further comprising a pixel defining layer disposed between the substrate and the partition structure, wherein the pixel defining layer has a second opening, a part of the electroluminescence element is disposed in the second opening, wherein in a cross-section of the display device, a first minimum width of the first opening of the partition structure is different from a second minimum width of the second opening.

17. The display device of claim 11, wherein the intermediate layer is in contact with the light conversion element.

* * * * *